United States Patent [19]
Itoh

[11] Patent Number: 5,703,390
[45] Date of Patent: Dec. 30, 1997

[54] SEMICONDUCTOR DEVICE HAVING FOUR POWER MOSFETS CONSTITUTING H BRIDGE CIRCUIT

[75] Inventor: Yukio Itoh, Tokyo, Japan

[73] Assignee: NEC Corporation, Tokyo, Japan

[21] Appl. No.: 550,863

[22] Filed: Oct. 31, 1995

[30] Foreign Application Priority Data

Oct. 31, 1994 [JP] Japan .................. 6-290427

[51] Int. Cl.[6] .................. H01L 29/76; H01L 29/94; H01L 31/062
[52] U.S. Cl. .................. 257/337; 257/341; 257/401
[58] Field of Search .................. 257/335, 336, 257/337, 338, 340, 341, 343, 344, 401

[56] References Cited

FOREIGN PATENT DOCUMENTS 61-148881  7/1986  Japan .
4-346477  12/1992  Japan .

Primary Examiner—Wael Fahmy
Attorney, Agent, or Firm—Sughrue, Mion, Zinn, Macpeak & Seas, PLLC

[57] ABSTRACT

A semiconductor device including first, second, third and fourth MOSFETs constituting an H bridge circuit. Each of the first and second MOSFETs is a vertical DMOSFET and each of the third and fourth MOSFETs is a lateral DMOSFET having a surface diffusion region formed in a portion of a drain region. The surface diffusion region has a conductivity type opposite that of a source region of the lateral DMOSFET and is electrically connected to the source region. Each of the surface diffusion regions may be made of a part of a channel stop region formed under a field insulator film. Each of the third and fourth MOSFETs may be a lateral DMOSFET having no surface diffusion region. Low on-resistance and small chip size of the device are obtained.

7 Claims, 7 Drawing Sheets

5,703,390

SEMICONDUCTOR DEVICE HAVING FOUR POWER MOSFETS CONSTITUTING H BRIDGE CIRCUIT

BACKGROUND OF THE INVENTION

1. Field of the Invention

The present invention relates to a semiconductor device and more particularly, to a semiconductor device having four metal-oxide-semiconductor field-effect transistors (MOSFETs) constituting an H bridge circuit.

2. Description of the Prior Art

Conventionally, as a bridge circuit for driving a load such as an electric motor, an H bridge circuit has been known well. FIG. 11 shows an example of the H bridge circuits.

The H bridge circuit shown in FIG. 11 is composed of a pair of n-channel power MOSFETs Tr1 and Tr2 forming upper arms of H and a pair of n-channel power MOSFETs Tr3 and Tr4 forming lower arms thereof. Drain electrodes D1 and D2 of the upper-arm MOSFETs Tr1 and Tr2 are coupled together, which are typically applied with a supply voltage. A source electrode S1 of the MOSFET Tr1 is connected to a drain electrode D3 of the MOSFET Tr3. A source electrode S2 of the MOSFET Tr2 is connected to a drain electrode D4 of the MOSFET Tr4. Source electrodes S3 and S4 of the lower-arm MOSFETs Tr3 and Tr4 are coupled together, which are typically connected to the ground. A motor M as a load of the bridge circuit is connected to a connection point X1 of the source and drain electrodes S1 and D3 and to a connection point X2 of the source and drain electrodes S2 and D4.

A conventional semiconductor device realizing the above H bridge circuit is shown in FIG. 1. This device is disclosed in the Japanese Non-Examined Patent Publication No. 61-148881, which was published in July 1986.

In FIG. 1, the above power MOSFETs Tr1, Tr2, Tr3 and Tr4 are made of N-channel lateral double-diffused MOSFETs (DMOSFETs) formed on a P-silicon substrate 31, respectively. These MOSFETs Tr1, Tr2, Tr3 and Tr4 are the same in structure and are laterally isolated by a $P^+$-isolation region 32 formed in the substrate 31.

An $N^-$-epitaxial layer 34 is formed on the substrate 31. This layer 34 is divided into first, second and third parts by the isolation region 32 extending vertically from the surface of the layer 34 to the substrate 31. The first part of the layer 34 is positioned in the center, the second part thereof is positioned on the left side, and the third part thereof is positioned on the right side.

First, second and third $N^+$-buried regions 33 are formed at the interface of the substrate 31 and the epitaxial layer 34. The first buried region 33 in the center is commonly used for the MOSFETs Tr1 and Tr2. The second buried region 33 on the left side is used for the MOSFET Tr3. The third buried region 34 on the right side is used for the MOSFET Tr4.

First, second and third $N^+$-sinker regions 35 are formed in the epitaxial layer 34 to extend from the surface of the layer 34 to the first, second and third buried regions 33, respectively. The first sinker region 35 in the center is commonly used for the MOSFETs Tr1 and Tr2. The second buried region 33 on the left side is used for the MOSFET Tr3. The third buried region 33 on the right side is used for the MOSFET Tr4.

The first buried region 33, the first sinker region 35 and the first part of the epitaxial layer 34 in the center form a common drain region of the MOSFETs Tr1 and Tr2. The second buried region 33, the second sinker region 35 and the second part of the epitaxial layer 34 form a drain region of the MOSFET Tr3. The third buried region 33, the third sinker region 35 and the third part of the epitaxial layer 34 form a drain region of the MOSFET Tr4.

First to eight P-base regions 36 are formed apart from each other in the epitaxial layer 34. The first to eight base regions 36 have top faces exposed from the epitaxial layer 34, respectively. The first and second base regions 34, which are formed in the central, first part of the epitaxial layer 34 adjacent to each other, are used for the MOSFET Tr1. The third and fourth base regions 34, which are also formed in the first part of the epitaxial layer 34 adjacent to each other, are used for the MOSFET Tr2. The fifth and sixth base regions 34, which are formed in the left, second part of the epitaxial layer 34 adjacent to each other, are used for the MOSFET Tr3. The seventh and eighth base regions 34, which are formed in the right, third part of the epitaxial layer 34 adjacent to each other, are used for the MOSFET Tr4.

First to sixteenth N-source regions 37 are formed in the first to eighth base regions 36. The first to sixteenth source regions 37 have top faces exposed from the epitaxial layer 34, respectively. The first and second source regions 37 which are formed in the first base region 36 adjacent to each other, and the third and fourth source regions 37 which are formed in the second base region 36 adjacent to each other, are used for the MOSFET Tr1. The fifth and sixth source regions 37 which are formed in the third base region 36 adjacent to each other, and the seventh and eighth source regions 37 which are formed in the fourth base region 36 adjacent to each other, are used for the MOSFET Tr2. The ninth and tenth source regions 37 which are formed in the fifth base region 36 adjacent to each other, and the eleventh and twelfth source regions 37 which are formed in the sixth base region 36 adjacent to each other, are used for the MOSFET Tr3. The thirteenth and fourteenth regions 37 which are formed in the seventh base region 36 adjacent to each other, and the fifteenth and sixteenth source regions 37 which are formed in the eighth base region 36 adjacent to each other, are used for the MOSFET Tr4.

First to twelfth gate insulator films 38 are formed on the surface of the epitaxial layer 34. First to twelfth gate electrodes 39 are formed on the first to twelfth gate insulator films 38, respectively.

The first gate insulator film 38 and the first gate electrode 39 are placed to bridge the first and second base regions 36 used for the MOSFET Tr1. The second gate insulator film 38 and the second gate electrode 39 are placed to partially overlap the left end of the first base region 36. The third gate insulator film 38 and the third gate electrode 39 are placed to partially overlap the right end of the second base region 36.

The fourth gate insulator film 38 and the fourth gate electrode 39 are placed to bridge the third and fourth base regions 36 used for the MOSFET Tr2. The fifth gate insulator film 38 and the fifth gate electrode 39 are placed to partially overlap the left end of the third base region 36. The sixth gate insulator film 38 and the sixth gate electrode 39 are placed to partially overlap the right end of the fourth base region 36.

The seventh gate insulator film 38 and the seventh gate electrode 39 are placed to bridge the fifth and sixth base regions 36 used for the MOSFET Tr3. The eighth gate insulator film 38 and eighth gate electrode 39 are placed to partially overlap the left end of the fifth base region 36. The ninth gate insulator film 38 and the ninth gate electrode 39 are placed to partially overlap the right end of the sixth base region 36.

The tenth gate insulator film 38 and the tenth gate electrode 39 are placed to bridge the seventh and eighth base regions 36 used for the MOSFET Tr4. The eleventh gate insulator film 38 and eleventh gate electrode 39 are placed to partially overlap the left end of the seventh base region 36. The twelfth gate insulator film 38 and the twelfth gate electrode 39 are placed to partially overlap the right end of the eighth base region 36.

An interlayer insulator film 40 made of a phosphor-silicate glass (PSG) film is formed to cover the first to twelfth gate electrodes 39 and the exposed epitaxial layer 34. The film 40 has contact holes right over the first to third sinker regions 35 and the first to eighth base regions 36, respectively, exposing partially the sinker regions 35 from the film 40.

A metal film such as an aluminum film is deposited on the interlayer insulator film 40 to be patterned, forming the four source electrodes S1, S2, S3 and S4, and the four drain electrodes D1, D2, D3 and D4. The source electrode S1 is contacted with the first and second base regions 36 and the first to fourth source regions 37 for the MOSFET Tr1 through the corresponding contact holes of the film 40. The source electrode S2 is contacted with the third and fourth base regions 36 and the fifth to eighth source regions 37 for the MOSFET Tr2 through the corresponding contact holes of the film 40. The source electrode S3 is contacted with the fifth and sixth base regions 36 and the ninth to twelfth source regions 37 for the MOSFET Tr3 through the corresponding contact holes of the film 40. The source electrode S4 is contacted with the seventh and eighth base regions 36 and the thirteenth to sixteenth source regions 37 for the MOSFET Tr4 through the corresponding contact holes of the film 40.

The drain electrodes D1 and D2 are formed to be united with each other and is contacted with the first sinker regions 35 for the MOSFETs Tr1 and Tr2 through the corresponding contact hole of the film 40. The drain electrode D3 is contacted with the second sinker regions 35 for the MOSFET Tr3 through the corresponding contact hole of the film 40. The drain electrode D4 is contacted with the third sinker regions 35 for the MOSFET Tr4 through the corresponding contact hole of the film 40.

The source electrode S1 and the drain electrode D3 are formed to be united with each other. The source electrode S2 and the drain electrode D4 are formed to be united with each other.

The first to third gate electrodes 39 for the DMOSFET Tr1 are coupled together to be electrically connected to a gate interconnection layer G1. The fourth to sixth gate electrodes 39 for the DMOSFET Tr2 are coupled together to be electrically connected to a gate interconnection layer G2. The seventh to ninth gate electrodes 39 for the DMOSFET Tr3 are coupled together to be electrically connected to a gate interconnection layer G3. The tenth to twelfth gate electrodes 39 for the DMOSFET Tr4 are coupled together to be electrically connected to a gate interconnection layer G4.

Another conventional semiconductor device realizing the above H bridge circuit is shown in FIG. 2. This device is disclosed in the Japanese Non-Examined Patent Publication No. 4-346477, which was published in December 1992.

In FIG. 2, the above power MOSFETs Tr1, Tr2, Tr3 and Tr4 are made of N-channel vertical MOSFETs formed on an N-semiconductor substructure 41, respectively. Since the MOSFETs Tr1, Tr2, Tr3 and Tr4 are the same in structure, only one of the MOSFETs Tr1, Tr2, Tr3 and Tr4 is shown in FIG. 2 for the sake of simplification of description.

A P-MOS well 42 and a P-peripheral well 43 are formed in the surface area of the substructure 41. One of the MOSFETs Tr1, Tr2, Tr3 and Tr4 is formed in the MOS well 42. Peripheral circuits such as field limiting rings (FLR) are formed in the peripheral well 43.

Two N-source regions 44 are formed in the MOS well 42. A P+-contact region 45 is formed in the peripheral well 43. Two gate oxide films 46 are formed at each side of the MOS well 42 on the surface of the substructure 41. Two gate electrodes 47 are formed on the gate oxide films 46, respectively.

An interlayer insulator film 48 is formed to cover the gate electrodes 47 and the exposed surface of the substructure 41. A source electrode 49a is formed to be contacted with the source regions 44 and the MOS well 42 through a contact hole of the film 48. A source interconnection or wiring layer 49b is formed to be contacted with the contact region 45 through another contact hole of the film 48.

A drain electrode 50 is formed on the back of the substructure 41. The substructure 41 except for wells 42 and 43 serves a drain region.

FIGS. 3, 4 and 5 are partial cross-sections of power MOSFETs that can be employed as one of the above power MOSFETs Tr1, Tr2, Tr3 and Tr4, respectively, which are represented in order to compare their on-resistances.

The MOSFET TrA shown in FIG. 3 is a vertical DMOSFET, the MOSFET TrB shown in FIG. 4 is a lateral DMOSFET having a surface diffusion region on a drain region, and the MOSFET TrC shown in FIG. 53 is a typical lateral DMOSFET having no surface diffusion region.

In FIGS. 3, 4 and 5, the reference numeral 51 indicates an N-silicon substrate, 52 indicates an N-epitaxial layer 52, 53 indicates P-well region, 54 indicates N-drain region, 55 indicates a field insulator film, 56 indicates a gate insulator film, 57 indicates a gate electrode, 58 indicates a P-surface diffusion region, 59 indicates P-base regions 59, 60 indicates an N-source region, 61 indicates an interlayer insulator film, 62 and 64 indicate a drain electrode, 62a indicates a back electrode, 63 indicates a source electrode, and 65 indicates an N-contact region.

When these transistors TrA, TrB and TrC are switched, i.e., are under the on/off operation, their on-resistances are expressed by the following theoretical equations (1), (2) and (3):

$$TrA: R_{onA} = R_{ch} + R_{jFET} + R_{epi} + R_{sub} \tag{1}$$

$$TrB: R_{onB} = R_{ch} + R_{D1} \tag{2}$$

$$TrC: R_{onC} = R_{ch} + R_{D2} \tag{3}$$

In the equations (1), (2) and (3), $R_{ch}$ is the channel region resistance, $R_{jFET}$ is the p-n junction resistance, $R_{epi}$ is the epitaxial layer resistance, $R_{sub}$ is the substrate resistance, $R_{D1}$ is the offset drain region resistance for the DMOSFET TrB with the surface diffusion region 58, and $R_{D2}$ is the offset drain region resistance for the DMOSFET TrC with no surface diffusion region.

If the breakdown voltage of the DMOSFET is 60 V or over, $R_{jFET} + R_{epi} + R_{sub} < R_{D1} < R_{D2}$ is established. Therefore, the on resistances $R_{onA}$, $R_{onB}$ and $R_{onC}$ has the relationship of $R_{onA} < R_{onB} < R_{onC}$.

The resistance difference between $R_{onA}$ and $R_{onB}$ increases with increasing breakdown voltage.

If the breakdown voltage of the DMOSFET is about 30 V, $R_{jFET} + R_{epi} + R_{sub} < R_{D2} < R_{D1}$ is established. Therefore, the on resistances $R_{onA}$, $R_{onB}$ and $R_{onC}$ has the relationship of $R_{onA} < R_{onC} < R_{onB}$.

The conventional semiconductor device shown in FIG. 1 has the lateral DMOSFETs Tr1, Tr2, Tr3 and Tr4 each of which is equivalent to the lateral DMOSFET TrC of FIG. 5. Therefore, the on-resistance per unit area is relatively large, which prevents the chip size from being reduced. In other words, the on-resistance increases with the decreasing chip size.

The conventional semiconductor device shown in FIG. 2 has the vertical DMOSFETs Tr1, Tr2, Tr3 and Tr4 each of which is equivalent to the vertical DMOSFET TrA of FIG. 3. Although the DMOSFET TrA has the minimum on-resistance of the three DMOSFETs TrA, TrB and TrC, the conventional device of FIG. 2 includes the peripheral well 43 requiring a comparatively large chip area. Consequently, the chip size reduction is difficult as well.

SUMMARY OF THE INVENTION

Accordingly, an object of the present invention is to provide a semiconductor device that enables not only to reduce the on-resistance but also to minimize the necessary chip size.

A semiconductor device according to the present invention contains first, second, third and fourth MOSFETs constituting an H bridge circuit on a semiconductor substrate. The first and second MOSFETs forming upper arms of the bridge circuit are different in structure from the third and fourth MOSFETs forming lower arms of the bridge circuit.

The first and second MOSFETs are preferably the same in structure as each other. The third and fourth MOSFETs also are preferably the same in structure as each other.

In a preferred embodiment, each of the first and second MOSFETs is a vertical DMOSFET and each of the third and fourth MOSFETS is a lateral DMOSFET with or without a surface diffusion region formed on an offset drain region. The surface diffusion region has the same conductivity type as that of a channel region (i.e., a base region) and/or a source region of the lateral DMOSFET and is electrically connected thereto.

Each of the surface diffusion regions is preferably made of a part of a channel stop region formed under a field insulator film. An advantage that no additional process is required for forming the surface diffusion regions is obtained because the surface diffusion regions can be formed during the step of forming the channel stop regions.

In another preferred embodiment, each of the first and second MOSFETs is a vertical DMOSFET and each of the third and fourth MOSFETs is a lateral DMOSFET.

With the semiconductor device according to the invention, the first and second MOSFETS forming the upper arms are different in structure from the third and fourth MOSFETs forming the lower arms. Therefore, for example, each of the first and second MOSFETs is a vertical DMOSFET enabling a reduced on-resistance and each of the third and fourth MOSFETs is a lateral DMOSFET enabling a reduced chip size.

Accordingly, compared with the case that the first to fourth MOSFETs are all lateral DMOSFETs, the device has a lower on-resistance and a smaller chip size.

Also, because the peripheral well, which is necessary for the conventional semiconductor device of FIG. 2 consisting of the four vertical DMOSFETs, is not required, the chip size can be further reduced.

DETAILED DESCRIPTION OF THE PREFERRED EMBODIMENTS

Figure 1:
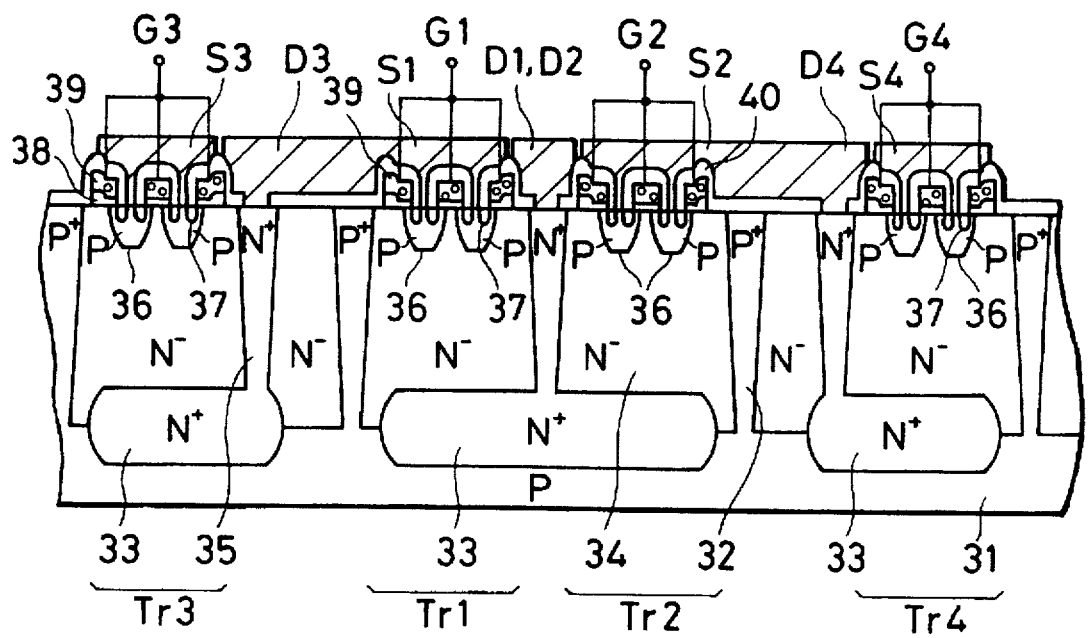
FIG. 1 is a partial cross-sectional view of a first example of conventional semiconductor devices.

Preferred embodiments of the present invention will be described below while referring to the drawings attached.

First Embodiment

Figure 6:
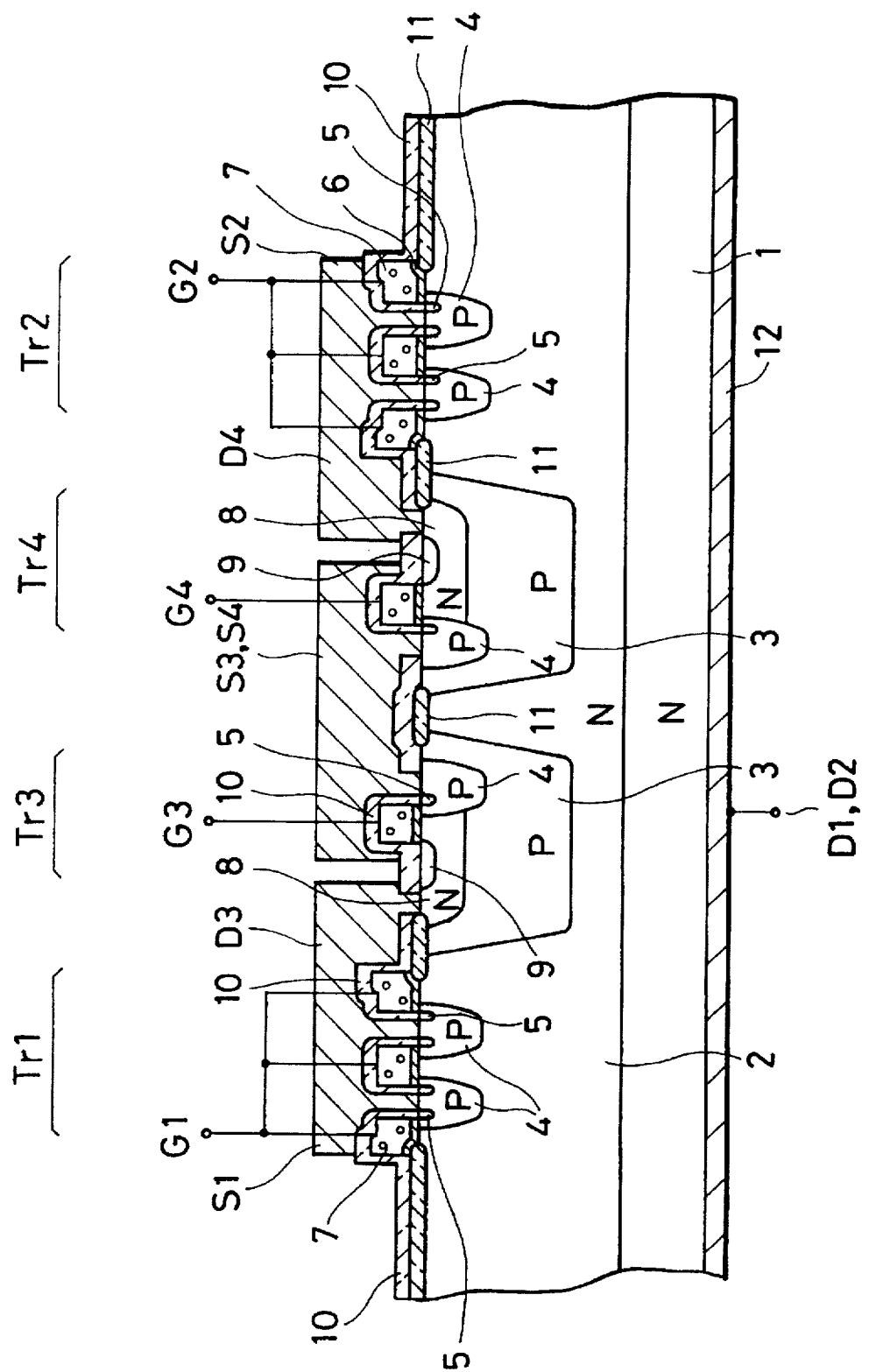
FIG. 6 is a partial cross-sectional view of a semiconductor device according to a first embodiment of the invention.
Figure 11:
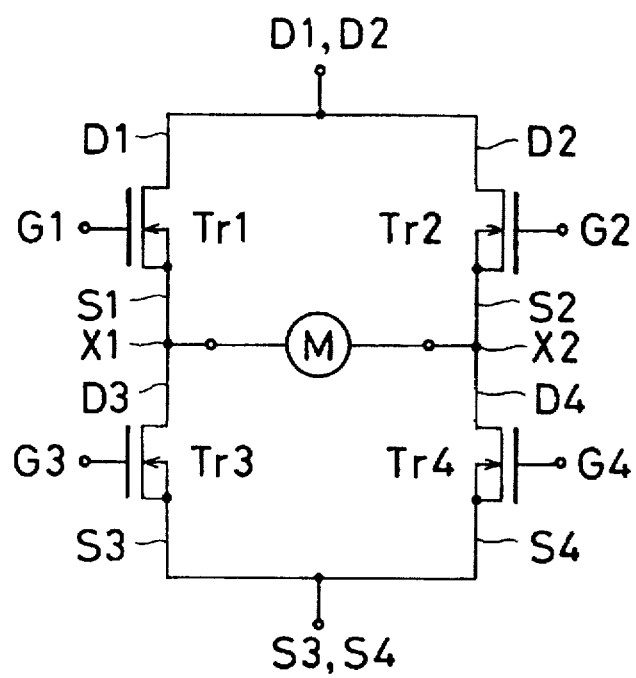
FIG. 11 is a circuit diagram of a conventional H bridge circuit used for driving an electric motor.

A semiconductor device according to a first embodiment has a configuration as shown in FIG. 6, which includes a first power MOSFET Tr1, a second power MOSFET Tr2, a third power MOSFET Tr3 and a fourth power MOSFET Tr4 constituting the H bridge circuit of FIG. 11.

In FIG. 6, the power MOSFETs Tr1 and Tr2 are made of N-channel lateral DMOSFETs and the power MOSFETs Tr3 and Tr4 are made of N-channel vertical DMOSFETs.

An N$^-$-epitaxial layer 2 is formed on a chief surface of an N-silicon substrate 1. First and second P-wells 3 are formed in the layer 2 apart from each other. A field insulator film 11 is selectively formed on the layer 2 to laterally isolate the layer 2, defining first and second wells 3 for the respective vertical DMOSFETs Tr3 and Tr4 and first and second active regions for the respective lateral DMOSFETs Tr1 and Tr2.

First and second P-base regions 4 for the DMOSFET Tr1 are formed apart from each other in the first active region of the epitaxial layer 2. Third and fourth P-base regions 4 for the DMOSFET Tr2 are formed apart from each other in the second active region thereof. Fifth and sixth P-base regions 4 for the DMOSFETs Tr3 and Tr4 are formed in the first and second wells 3, respectively.

For the DMOSFET Tr1, first and second N-source regions 5 are formed in the first base region 4, and third and fourth N-source regions 5 are formed in the second base region 4. For the DMOSFET Tr2, fifth and sixth N-source regions 5 are formed in the third base region 4, and seventh and eighth N-source regions 5 are formed in the fourth base region 4.

For the DMOSFET Tr3, a ninth N-source region 5 is formed in the fifth base region 4 of the first P-well region 3. For the DMOSFET Tr4, a tenth N-source region 5 is formed in the sixth base region 4 of the second P-well region 3.

A first N-drain region 8 for the DMOSFET Tr3 is formed in the first P-well region 3 adjacent to the fifth base region 4. A second N-drain region 8 for the DMOSFET Tr4 is formed in the second P-well region 3 adjacent to the sixth base region 4.

A first P-surface diffusion region 9 for the DMOSFET Tr3 is formed on the first drain region 8. A second P-surface diffusion region 9 for the DMOSFET Tr4 is formed on the second drain region 8.

First to eighth gate insulator films 6 are formed on the exposed surface of the epitaxial layer 2 and the wells 3. First to eighth gate electrodes 7 are formed on the first to eighth gate insulator films 6, respectively.

The first gate insulator film 6 and the first gate electrode 7 are placed to bridge the first and second P-base regions 4 for the MOSFET Tr1. The second gate insulator film 6 and the second gate electrode 7 are placed to partially overlap the left end of the first base region 4. The third gate insulator film 6 and the third gate electrode 7 are placed to partially overlap the right end of the second base region 4.

The fourth gate insulator film 6 and the fourth gate electrode 7 are placed to bridge the third and fourth P-base regions 4 for the MOSFET Tr2. The fifth gate insulator film 6 and the fifth gate electrode 7 are placed to partially overlap the left end of the third base region 4. The sixth gate insulator film 6 and the sixth gate electrode 7 are placed to partially overlap the right end of the fourth base region 4.

The seventh gate insulator film 6 and the seventh gate electrode 7 are placed to bridge the fifth base region 4 and the first N-drain region 9 for the MOSFET Tr3. The eighth gate insulator film 6 and eighth gate electrode 7 are placed to bridge the sixth base region 4 and the second N-drain region 9 for the MOSFET Tr4.

An interlayer insulator film 10 is formed to cover the first to eighth gate electrodes 39, the field insulator film 11, the exposed epitaxial layer 34 and the exposed wells 3. The film 10 has contact holes right over the first to sixth P-base regions 4 and the first and second N-drain regions 8, respectively, exposing partially the regions 4 and 8 from the film 10.

A metal film such as an aluminum film is deposited on the interlayer insulator film 10 to be patterned, forming the four source electrodes S1, S2, S3 and S4, and the four drain electrodes D1, D2, D3 and D4.

The source electrode S1 is contacted with the first and second base regions 4 and the first to fourth source regions 5 for the MOSFET Tr1 through the corresponding contact holes of the film 10. The source electrode S2 is contacted with the third and fourth base regions 4 and the fifth to eighth source regions 5 for the MOSFET Tr2 through the corresponding contact holes of the film 10.

The source electrode S3 is contacted with the fifth base region 4 and the ninth source region 5 for the MOSFET Tr3 through the corresponding contact holes of the film 40. The source electrode S4 is contacted with the sixth base region 4 and the tenth source region 5 for the MOSFET Tr4 through the corresponding contact holes of the film 40.

The drain electrode D3 is contacted with the first N-drain region 8 for the MOSFET Tr3 through the corresponding contact hole of the film 10. The drain electrode D4 is contacted with the second N-drain region 8 for the MOSFET Tr4 through the corresponding contact hole of the film 10.

Another metal film 12 such as an aluminum film is deposited on the other chief surface of the substrate 1, forming the drain electrodes D1 and D2 for the DMOSFETs Tr1 and Tr2. The drain electrodes D1 and D2 are contacted with the substrate 1 and are electrically connected to the first and second base regions 4 for the DMOSFET Tr1 and to the third and fourth base regions 4 for the DMOSFET Tr2 through the epitaxial layer 2.

The first to third gate electrodes 7 for the DMOSFET Tr1 are coupled together to be electrically connected to a gate interconnection layer G1. The fourth to sixth gate electrodes 7 for the DMOSFET Tr2 are coupled together to be electrically connected to a gate interconnection layer G2. The seventh gate electrode 7 for the DMOSFET Tr3 is electrically connected to a gate interconnection layer G3. The eighth gate electrode 7 for the DMOSFET Tr4 is electrically connected to a gate interconnection layer G4.

Although not shown in FIG. 6, the first and second P-surface diffusion regions 9 of the DMOSFETs Tr3 and Tr4 are electrically connected to the corresponding source electrodes D3 and D4 in order to fix their electric potentials.

As described above, the vertical DMOSFET Tr1 is composed of the N-epitaxial layer 2 serving as its drain region, the first and second P-base regions 4, the first to fourth N-source regions 5, the first to third gate insulator films 6, and the first to third gate electrodes 7. The vertical DMOSFET Tr2 is composed of the N-epitaxial layer 2 serving as its drain region, the third and fourth P-base regions 4, the fifth to eighth N-source regions 5, the fourth to sixth gate insulator films 6, and the fourth to sixth gate electrodes 7.

The lateral DMOSFET Tr3 is composed of the fifth P-base region 4, the ninth N-source region 5, the first N-drain region 8 with the offset structure, the first P-surface diffusion region 9, the first gate insulator film 6, and the first gate electrode 7. The lateral DMOSFET Tr4 is composed of the sixth P-base region 4, the tenth N-source region 5, the second N-drain region 8 with the offset structure, the second P-surface diffusion region 9, the second gate insulator film 6, and the second gate electrode 7.

The semiconductor device according to the first embodiment having the above structure is fabricated by the following process sequence. Since the upper-arm DMOSFETs Tr1 and Tr2 are the same and lower-arm DMOSFETS Tr3 and Tr4 are also the same, only the DMOSFETs Tr1 and Tr3 are shown here for the sake of simplification.

Figure 7A:
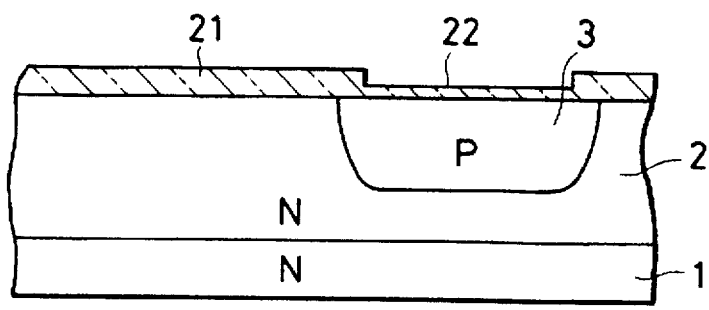
FIGS. 7A to 7D are partial cross-sectional views of the semiconductor device according to the first embodiment of the invention, which shows its fabrication process sequence, respectively.

First, as shown in FIG. 7A, the N-silicon substrate 1 having the resistivity of 0.001 to 0.002 $\Omega \cdot$cm is prepared and then, the N-epitaxial layer 2 is formed on the chief surface of the substrate 1. The resistivity and thickness of the layer 2 are selected according to the breakdown voltages of the DMOSFETs Tr1 and Tr2 forming the upper arms.

The substrate 1 with the epitaxial layer 2 is selectively oxidized to form a thick silicon dioxide ($SiO_2$) film 21 having a thickness of several thousands angstroms (Å). The substrate 1 with the epitaxial layer 2 is oxidized again to form a thin silicon dioxide film 22 having a thickness of several hundreds angstroms (Å) on the exposed epitaxial layer 2 from the film 21. The epitaxial layer 2 is selectively ion-implanted with boron (B) through the film 21 using the $SiO_2$ film 21 as a mask and then, is annealed to diffuse the implanted boron atoms, forming the P-well region 3 having a depth of 5 μm or more right below the $SiO_2$ film 22. The dose is in the order of $10^{13}$ $cm^{-2}$.

Figure 7B:
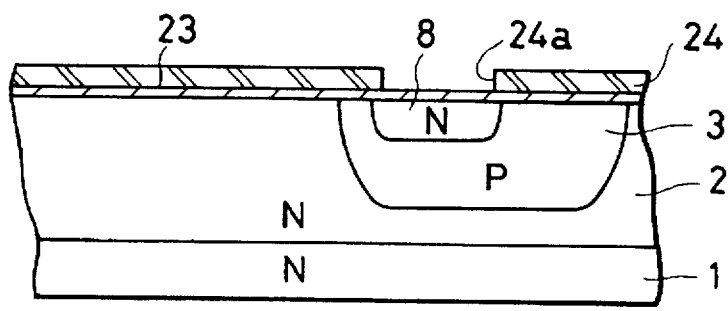

Next, after removing the $SiO_2$ films 21 and 22, a thin $SiO_2$ film 23 is formed again on the surface of the epitaxial layer 2 and well region 3. A photoresist film 24 having a thickness of several micrometers is formed on the $SiO_2$ film 23 and is patterned to have a window 24a, as shown in FIG. 7B. The window 24a is placed right over a position for the drain region 8.

Using the patterned photoresist film 24 as a mask, the P-well region 3 is selectively ion-implanted with phosphorus (P) and then, is annealed to diffuse the implanted phosphorus atoms, forming the N-drain region 8 in the well region 3 right below the window 24a. The dose is in the order of $10^{13}$ cm$^{-2}$. The state at this stage is shown in FIG. 7B.

Figure 7C:
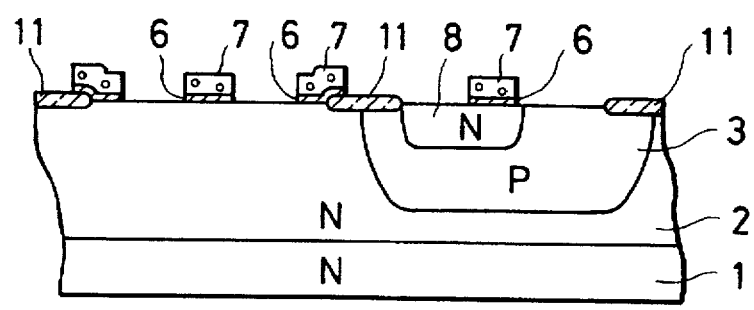

Subsequently, after removing the photoresist film 24, a silicon nitride (Si$_3$N$_4$) film (not shown) is selectively formed on the SiO$_2$ film 23. Then, using the Si$_3$N$_4$ film as a mask, the substrate 1 is selectively oxidized to form the field insulator film 11 on the surfaces of the epitaxial layer 2 and the well region 3, as shown in FIG. 7C. Through this process, the SiO$_2$ film 23 is patterned to produce the first, second and third gate insulator films 6 for the DMOSFET Tr1 and the seventh gate insulator film 6 for the DMOSFET Tr3. The first, second and third gate electrodes 7 for the DMOSFET Tr1 and the seventh gate electrode 7 for the DMOSFET Tr3 are formed on the first, second, third and seventh gate insulator films 6, respectively. The state at this stage is shown in FIG. 7C.

Figure 7D:
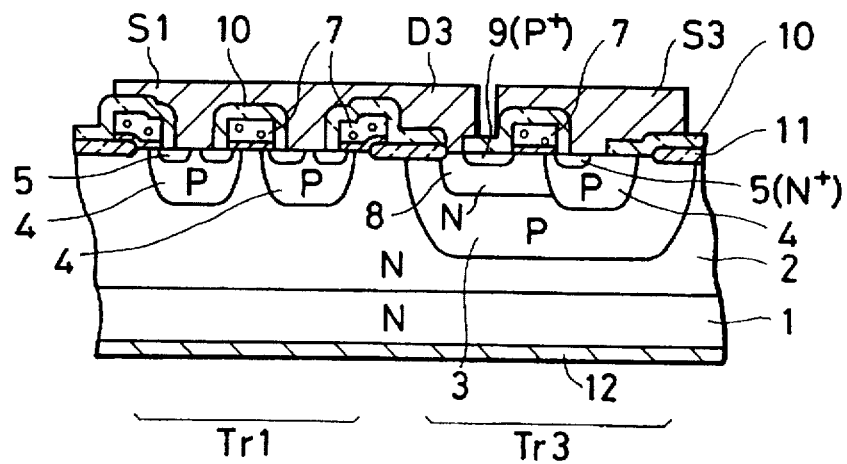

Further, as shown in FIG. 7D, using the photolithography and etching techniques and the ion-implantation technique, desired impurity-doped regions are formed. Specifically, the first P-surface diffusion region 9 is formed in the first N-drain region 8. The first and second P-base regions 4 are formed in the epitaxial layer 2, and the fifth P-base region 4 is formed in the P-well region 3. The first and second N-source regions 5 are formed in the first base region 4, the third and fourth N-source regions 5 are formed in the second base region 4, and the ninth N-source region 5 is formed in the fifth base region 4.

The interlayer insulator film 10 is then formed on the entire substrate 1 to cover the gate electrodes 7 and the exposed regions 4, 5 and 8. The metal film is formed on the film 10 to be patterned, forming the source electrodes S1 and S3 contacted with the source regions 5 and the base regions 4 and the drain electrode D3 contacted with the drain region 8.

The other chief surface of the substrate 1 is polished to have a predetermined thickness. The metal film 12 is formed on the polished chief surface of the substrate 1, forming the drain electrodes D3 and D4 electrically connected to the first and second base regions 4 through the epitaxial layer 2. Thus, the semiconductor device with the structure shown in FIG. 6 is obtained.

With the semiconductor device according to the first embodiment, the DMOSFETs Tr1 and Tr2 forming the upper arms are of the vertical type, which enables a lower on-resistance than the lateral DMOSFET, and the DMOSFETs Tr3 and Tr4 forming the lower arms are of the lateral type with the surface diffusion regions 9, which enables a reduced chip size. Therefore, this device has a lower on-resistance and a smaller chip size than the case that the DMOSFETs Tr1, Tr2, Tr3 and Tr4 are all lateral DMOSFETs by 30 to 40%.

Figure 2:
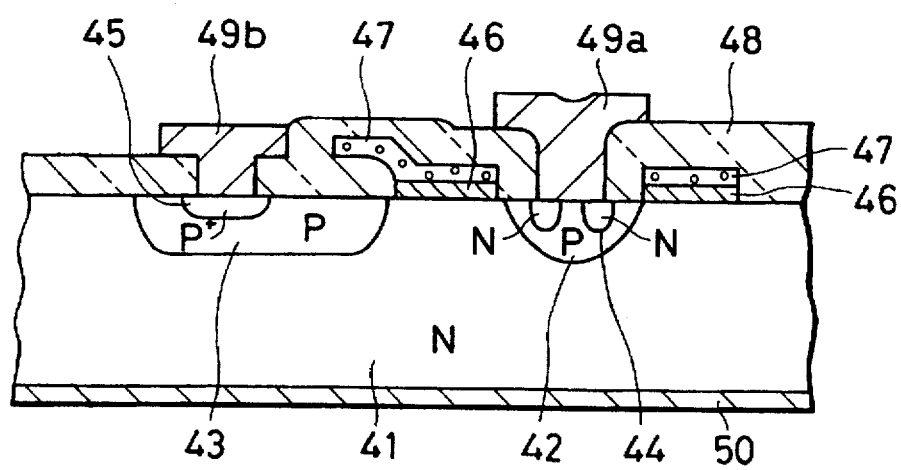
FIG. 2 is a partial cross-sectional view of a second example of conventional semiconductor devices.
Figure 3:
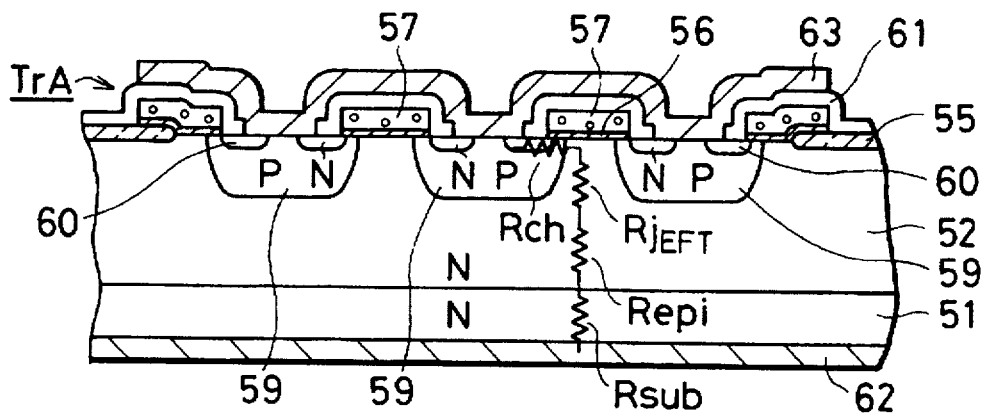
FIG. 3 is a partial cross-sectional view of a vertical DMOSFET.
Figure 4:
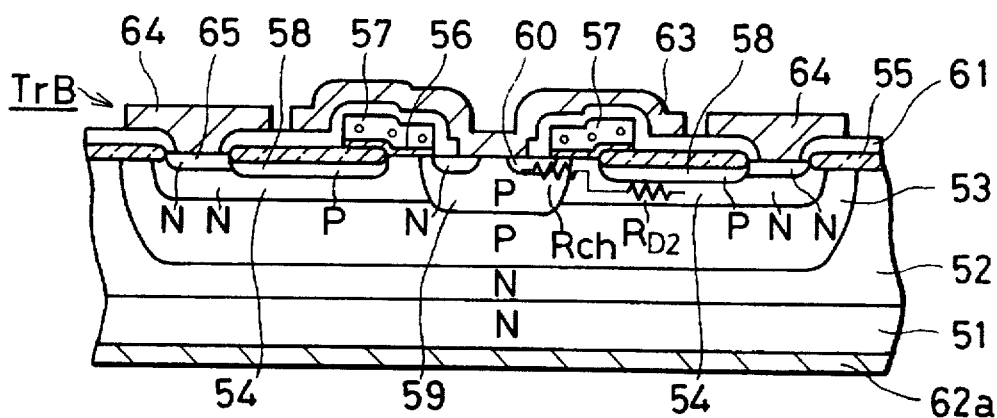
FIG. 4 is a partial cross-sectional view of a lateral DMOSFET.
Figure 5:
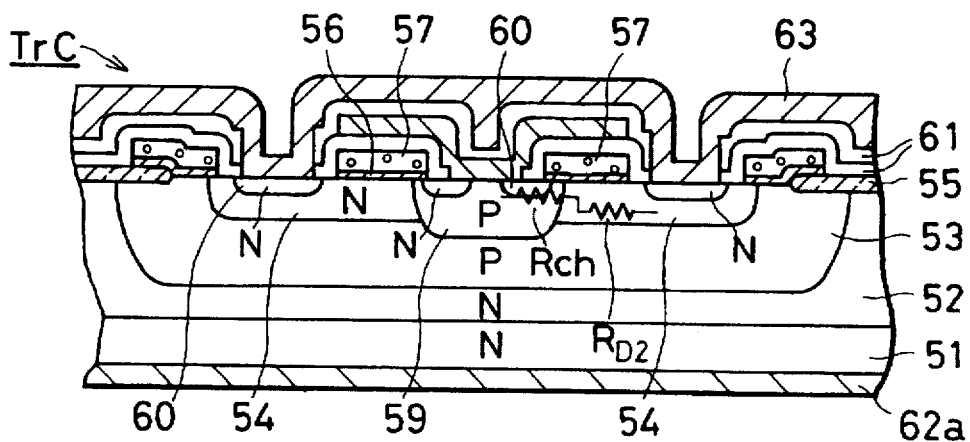
FIG. 5 is a partial cross-sectional view of another lateral DMOSFET.

Since the peripheral well which is necessary for the conventional semiconductor device of FIG. 2 consisting of the four vertical DMOSFETs is not required, the chip size can be further reduced.

As seen from the above equations (1), (2) and (3) and their relating description, the device according to the first embodiment is effective for the case of the breakdown voltage of 60 V or higher.

Second Embodiment

Figure 8:
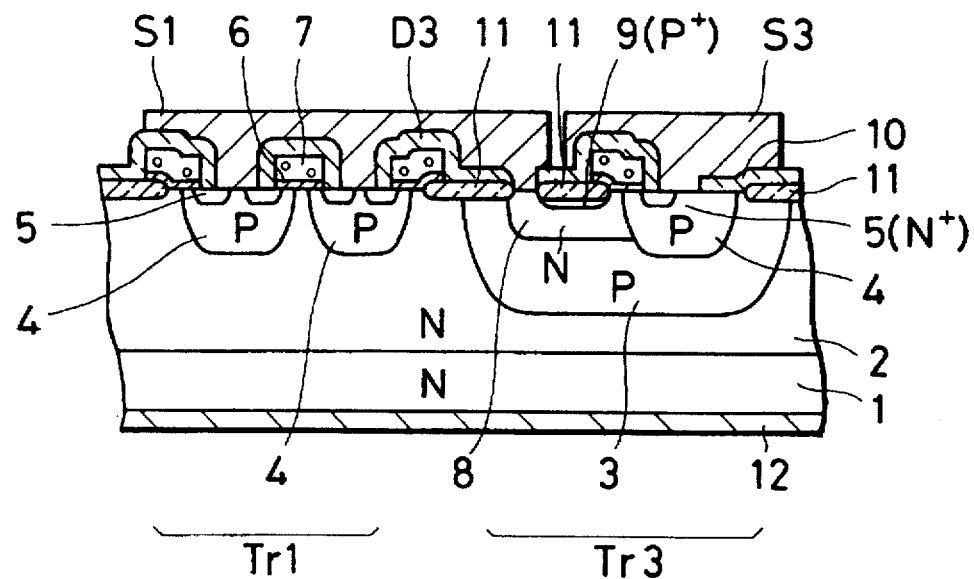
FIG. 8 is a partial cross-sectional view of a semiconductor device according to a second embodiment of the invention.

FIG. 8 shows a semiconductor device according to a second embodiment, which is the same in configuration as that of the first embodiment except that the field oxide film 11 is placed on the P-surface diffusion regions 9, in other words, the diffusion regions 9 are positioned right below the field insulator film 11. Therefore, no description about the same structure is shown here by attaching the same reference numerals to the same elements in FIG. 8 for the sake of simplification.

In this embodiment, the surface diffusion regions 9 are made of a channel stop region formed under the field insulator film 11. Because the surface diffusion regions can be formed during the step of forming the channel stop regions by ion-implantation, no additional process step such as a photolithography or etching process is required for forming the surface diffusion regions 9.

Third Embodiment

Figure 9:
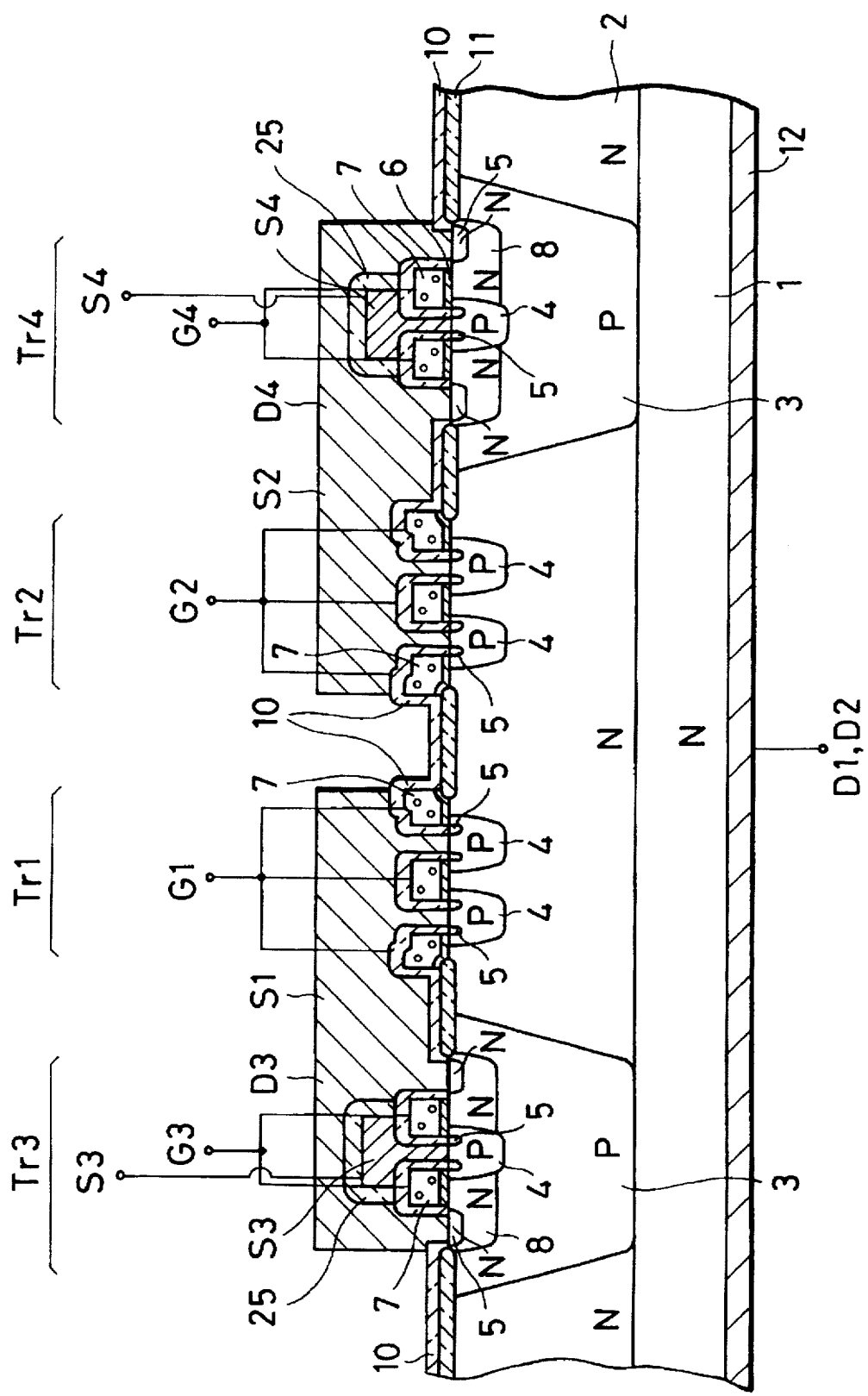
FIG. 9 is a partial cross-sectional view of a semiconductor device according to a third embodiment of the invention.

FIG. 9 shows a semiconductor device according to a third embodiment, which is the same in configuration as that of the first embodiment except that the P-surface diffusion regions 9 are not provided. Therefore, description relating to the same structure is omitted here by attaching the same reference numerals to the same elements in FIG. 9 for the sake of simplification.

Specifically, in this embodiment, the DMOSFETs Tr1 and Tr2 are the same vertical DMOSFETs as those of the first embodiment, and the DMOSFETs Tr3 and Tr4 are the typical lateral DMOSFETs without the surface diffusion regions.

As shown in FIG. 9, the fifth P-base region 4 for the DMOSFETs Tr3 is formed in the first well 3, and the sixth P-base region 4 for the DMOSFET Tr4 is formed in the second well 3.

First and second N-drain regions 8 for the DMOSFET Tr3 are formed in the first P-well region 3 at each side of the fifth P-base region 4 adjacent to the fifth base region 4. Third and fourth N-drain regions 8 for the DMOSFET Tr4 are formed in the second P-well region 3 at each side of the sixth P-base region 4 adjacent to the sixth base region 4.

For the DMOSFET Tr3, ninth and tenth N-source regions 5 are formed in the fifth base region 4, and eleventh and twelfth N-source regions 5 are formed in the first N-drain region 8. For the DMOSFET Tr4, eleventh and twelfth N-source regions 5 are formed in the sixth base region 4, and thirteenth and fourteenth N-source regions 5 are formed in the second drain region 8.

Seventh to tenth gate insulator films 6 are formed on the exposed surface of the first and second well regions 3. Seventh to tenth gate electrodes 7 are formed on the seventh to tenth gate insulator films 6, respectively.

For the MOSFET Tr3, the seventh gate insulator film 6 and the seventh gate electrode 7 are placed to bridge the fifth base region 4 and the first N-drain region 8, and the eighth gate insulator film 6 and the eighth gate electrode 7 are placed to bridge the fifth base region 4 and the second N-drain region 8.

For the MOSFET Tr4, the ninth gate insulator film 6 and the ninth gate electrode 7 are placed to bridge the sixth base region 4 and the third N-drain region 8, and the tenth gate insulator film 6 and the tenth gate electrode 7 are placed to bridge the sixth base region 4 and the fourth N-drain region 8.

An interlayer insulator film 10 is formed to cover the first to tenth gate electrodes 39, the field insulator film 11, the exposed epitaxial layer 34 and the exposed wells 3. The film 10 has contact holes right over the first to sixth P-base regions 4 and the first and fourth N-drain regions 8, respectively, exposing partially the regions 4 and 8 from the film 10.

A metal film such as an aluminum film is deposited on the interlayer insulator film 10 to be patterned, forming the four source electrodes S1, S2, S3 and S4, and the four drain electrodes D1, D2, D3 and D4.

The source electrode S3 is contacted with the fifth P-base region 4 and the ninth and tenth source regions 5 for the MOSFET Tr3 through the corresponding contact holes of the film 10. The source electrode S4 is contacted with the sixth P-base region 4 and the eleventh and twelfth regions 5 for the MOSFET Tr4 through the corresponding contact holes of the film 10.

The drain electrode D3 is contacted with the ninth and tenth N-source regions 5 for the MOSFET Tr3 through the corresponding contact holes of the film 10. The drain electrode D4 is contacted with the eleventh and twelfth N-source regions 5 for the MOSFET Tr4 through the corresponding contact holes of the film 10.

The seventh and eighth gate electrodes 7 for the DMOSFET Tr3 are electrically connected to a gate interconnection layer G3. The ninth and tenth gate electrodes 7 for the DMOSFET Tr4 are electrically connected to a gate interconnection layer G4.

As described above, in the third embodiment, the lateral DMOSFET Tr3 is composed of the fifth P-base region 4, the ninth to twelfth N-source regions 5, the first and second N-drain regions 8 with the offset structure, the first and second gate insulator films 6, and the first and second gate electrodes 7. The lateral DMOSFET Tr4 is composed of the sixth P-base region 4, the thirteenth to sixteenth N-source regions 5, the third and fourth N-drain regions 8 with the offset structure, the third and fourth gate insulator films 6, and the third and fourth gate electrodes 7.

The semiconductor device according to the third embodiment having the above structure is fabricated by the following process sequence.

Figure 10A:
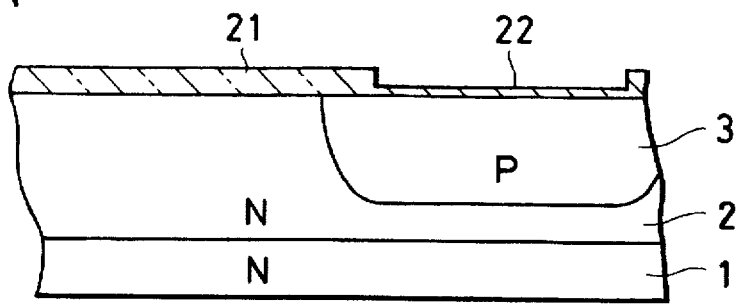
FIGS. 10A to 10D are partial cross-sectional views of the semiconductor device according to the second embodiment of the invention, which shows its fabrication process sequence, respectively.

First, as shown in FIG. 10A, the N-silicon substrate 1 is prepared and then, the N-epitaxial layer 2 is formed on the chief surface of the substrate 1. The substrate 1 with the epitaxial layer 2 is selectively oxidized to form a thick $SiO_2$ film 21. The substrate 1 with the epitaxial layer 2 is oxidized again to form a thin $SiO_2$ film 22 on the exposed epitaxial layer 2 from the $SiO_2$ film 21. The epitaxial layer 2 is selectively ion-implanted with boron (B) through the $SiO_2$ film 22 using the $SiO_2$ film 21 as a mask and then, is annealed to diffuse the implanted boron atoms, forming the P-well region 3 having a depth of 5 µm or more right below the $SiO_2$ film 22. These process steps are the same as those in the first embodiment.

Figure 10B:
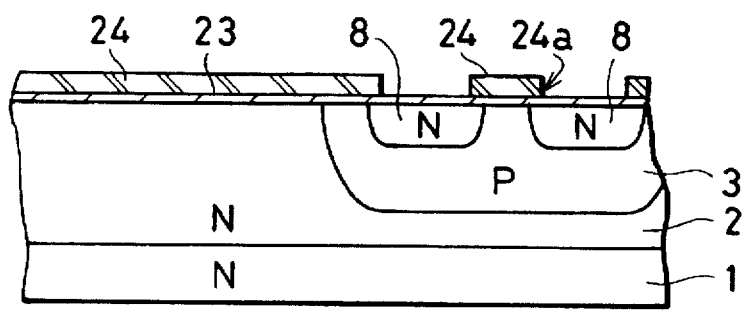

Next, after removing the $SiO_2$ films 21 and 22, a thin $SiO_2$ film 23 is formed again on the surface of the epitaxial layer 2 and well region 3. A photoresist film 24 is formed on the $SiO_2$ film 23 and is patterned to have windows 24a, as shown in FIG. 10B. The windows 24a are placed right over positions for the drain regions 8.

Using the patterned photoresist film 24 as a mask, the P-well region 3 is selectively ion-implanted with phosphorus (P) and then, is annealed to diffuse the implanted phosphorus atoms, forming the N-drain regions 8 in the well region 3 right below the respective windows 24a. The state at this stage is shown in FIG. 10B.

Figure 10C:
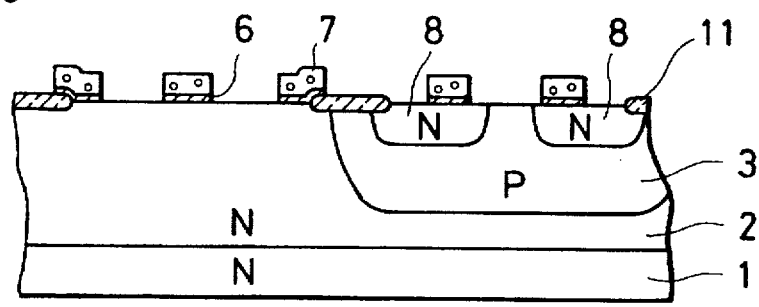

Subsequently, after removing the photoresist film 24, the substrate 1 is selectively oxidized to form the field insulator film 11 on the surfaces of the epitaxial layer 2 and the well region 3, as shown in FIG. 10C. Through this process, the $SiO_2$ film 23 is patterned to produce the first to fourth gate insulator films 6 for the DMOSFET Tr1 and the ninth and tenth gate insulator films 6 for the DMOSFET Tr3. The first, second and third gate electrodes 7 for the DMOSFET Tr1 and the seventh and eighth gate electrodes 7 for the DMOSFET Tr3 are formed on the first to third and the seventh and eighth gate insulator films 6, respectively. The state at this stage is shown in FIG. 10C.

Figure 10D:
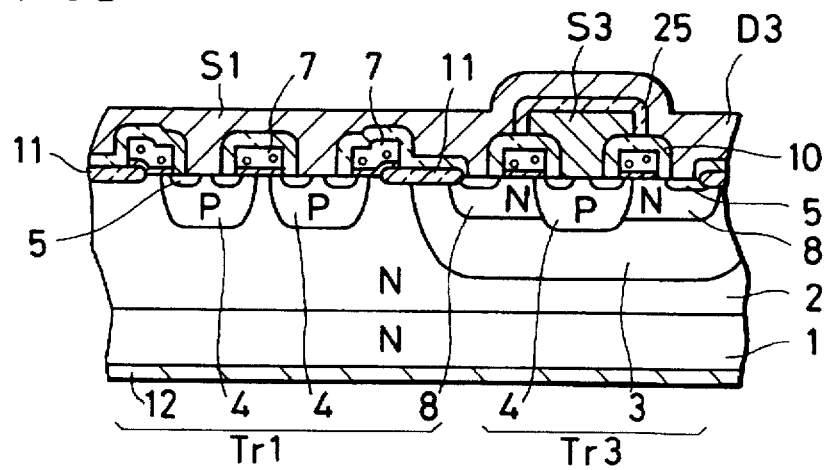

Further, as shown in FIG. 10D, desired impurity-doped regions are formed in self alignment with the first to third and the seventh and eighth gate electrodes by ion-implantation using these electrodes 7 as a mask. Specifically, the first and second P-base regions 4 are formed in the epitaxial layer 2, and the fifth P-base region 4 is formed in the P-well region 3. The first and second N-source regions 5 are formed in the first base region 4, the third and fourth N-source regions 5 are formed in the second base region 4, and the ninth to twelfth N-source regions 5 are formed in the fifth and sixth base regions 4.

The interlayer insulator film 10 is then formed on the entire substrate 1 to cover all the gate electrodes 7 and the exposed regions 4, 5 and 8. The metal film is formed on the film 10 to be patterned, forming the source electrodes S1 and S3 and the drain electrode D3.

In the same way as that of the first embodiment, after the other chief surface of the substrate 1 is polished, the metal film 12 is formed on the polished chief surface, forming the drain electrodes D1 and D2. Thus, the semiconductor device with the structure shown in FIG. 9 is obtained.

With the semiconductor device according to the third embodiment, the DMOSFETs Tr1 and Tr2 forming the upper arms are of the vertical type, which enables a lower on-resistance than the lateral DMOSFET, and the DMOSFETs Tr3 and Tr4 forming the lower arms are of the typical, lateral type without the surface diffusion regions 9, which enables a reduced chip size. Therefore, this device has a lower on-resistance and a smaller chip size than the case that the MOSFETs Tr1, Tr2, Tr3 and Tr4 are all lateral DMOSFETs by 30 to 40%.

Also, since the peripheral well is not required, the chip size can be further reduced.

As seen from the above equations (1), (2) and (3) and their relating description, the device according to the third embodiment is effective for the case of the breakdown voltage of 30 V.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A semiconductor device comprising:
   first, second, third and fourth MOSFETs formed in a semiconductor substrate;
   drains of said first and second MOSFETs being coupled together;
   sources of said third and fourth MOSFETs being coupled together;
   a source of said first MOSFET being connected to a drain of said third MOSFET;
   a source of said second MOSFET being connected to a drain of said fourth MOSFET; and
   said first, second, third and fourth MOSFETs constituting an H bridge circuit;
   wherein said first and second MOSFETS are different in structure from said third and fourth MOSFETs.

2. A semiconductor device as claimed in claim 1, wherein each of said first and second MOSFETs is a vertical DMOS- FET and each of said third and fourth MOSFETs is a lateral DMOSFET having a surface diffusion region formed in a portion of said a drain region of said third and fourth MOSFETs;

and wherein each of said surface diffusion regions have a conductivity type opposite that of a source region of said lateral DMOSFET and is electrically connected to said source region.

3. A semiconductor device as claimed in claim 2, wherein each of said surface diffusion regions is made of a part of a channel stop region formed under a field insulating film.

4. A semiconductor device as claimed in claim 1, wherein each of said first and second MOSFETs is a vertical DMOSFET and each of said third and fourth MOSFETs is a lateral DMOSFET.

5. A semiconductor device comprising:
(a) first, second, third and fourth MOSFETs formed in a semiconductor substrate of a first conductivity type;
a field insulating film formed on a first surface of said substrate to laterally isolate said first, second, third and fourth MOSFETs;
drains of said first and second MOSFETs being coupled together;
sources of said third and fourth MOSFETs being coupled together;
a source of said first MOSFET being connected to a drain of said third MOSFET;
a source of said second MOSFET being connected to a drain of said fourth MOSFET; and
said first, second, third and fourth MOSFETs constituting an H bridge circuit;
(b) each of said first and second MOSFETs being a vertical DMOSFET and each of said third and fourth MOSFETs being a lateral DMOSFET having a surface diffusion region formed in a portion of a drain region of said third and fourth MOSFETS;
(c) said vertical DMOSFET having:
a base region of a second conductivity type formed in said substrate, said second conductivity type being opposite to said first conductivity type;
a source region of said first conductivity type formed in said base region;
a gate insulator film formed on a first surface of said substrate;
a gate electrode formed on said gate insulator film;
a source electrode in contact with said source region;
a drain electrode formed on a second surface of said substrate;
(d) said lateral DMOSFET having:
a well region of a second conductivity type formed in said substrate, said second conductivity type being opposite to said first conductivity type;
a base region of said second conductivity type formed in said well region;
a source region of said first conductivity type formed in said base region;
a drain region of said first conductivity type formed in said well region;
a surface diffusion region of said second conductivity type formed in said drain region;
a gate insulator film formed on a first surface of said substrate;
a gate electrode formed on said gate insulator film;
a source electrode in contact with said source region;
a drain electrode in contact with said drain region;
said surface diffusion region being electrically connected to said source region.

6. A semiconductor device as claimed in claim 5, wherein each of said surface diffusion regions is made of a part of a channel stop region formed under said field insulating film.

7. A semiconductor device comprising:
(a) first, second, third and fourth MOSFETs formed in a semiconductor substrate of a first conductivity type;
a field insulating film formed on a first surface of said substrate to laterally isolate said first, second, third and fourth MOSFETS;
drains of said first and second MOSFETs being coupled together;
sources of said third and fourth MOSFETs being coupled together;
a source of said first MOSFET being connected to a drain of said third MOSFET;
a source of said second MOSFET being connected to a drain of said fourth MOSFET; and
said first, second, third and fourth MOSFETs constituting an H bridge circuit;
(b) each of said first and second MOSFETs being a vertical DMOSFET and each of said third and fourth MOSFETs being a lateral DMOSFET having a surface diffusion region formed in a portion of said a drain region of said third and fourth MOSFETs;
(c) said vertical DMOSFET having:
a base region of a second conductivity type formed in said substrate, said second conductivity type being opposite to said first conductivity type;
a source region of said first conductivity type formed in said base region;
a gate insulator film formed on said first surface of said substrate;
a gate electrode formed on said gate insulator film;
a source electrode in contact with said source region; and
a drain electrode formed on a second surface of said substrate; and
(d) said lateral DMOSFET having:
a well region of said second conductivity type formed in said substrate;
a base region of said second conductivity type formed in said well region;
a source region of said first conductivity type formed in said base region;
a drain region of said first conductivity type formed in said well region;
a gate insulator film formed on said first surface of said substrate;
a gate electrode formed on said gate insulator film;
a source electrode in contact with said source region; and
a drain electrode in contact with said drain region.

* * * * *